(12) United States Patent
Yamasaki et al.

(10) Patent No.: US 7,652,328 B2
(45) Date of Patent: Jan. 26, 2010

(54) SEMICONDUCTOR DEVICE AND METHOD OF MANUFACTURING THE SAME

(75) Inventors: Hiroyuki Yamasaki, Yokohama (JP); Kouji Matsuo, Yokohama (JP); Seiichi Iwasa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 11/705,792

(22) Filed: Feb. 14, 2007

(65) Prior Publication Data
US 2007/0200170 A1 Aug. 30, 2007

(30) Foreign Application Priority Data
Feb. 15, 2006 (JP) ............... 2006-038249

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/330; 257/327; 257/329

(58) Field of Classification Search ............... 257/327, 257/329, 330, 334
See application file for complete search history.

(56) References Cited

U.S. PATENT DOCUMENTS

| | | | |
|---|---|---|---|
| 6,060,911 A * | 5/2000 | Schulz et al. | 326/119 |
| 6,310,367 B1 | 10/2001 | Yagishita et al. | |
| 6,621,131 B2 | 9/2003 | Murthy et al. | |
| 6,815,279 B2 | 11/2004 | Yagishita et al. | |
| 7,105,413 B2 * | 9/2006 | Nahm et al. | 438/305 |
| 7,238,561 B2 * | 7/2007 | Zhang et al. | 438/197 |
| 7,534,706 B2 * | 5/2009 | Boyd | 438/574 |
| 2006/0131665 A1 * | 6/2006 | Murthy et al. | 257/384 |
| 2006/0148220 A1 * | 7/2006 | Lindert et al. | 438/514 |
| 2007/0126036 A1 * | 6/2007 | Ohta et al. | 257/288 |
| 2008/0006818 A1 * | 1/2008 | Luo et al. | 257/19 |

\* cited by examiner

*Primary Examiner*—Phuc T Dang
(74) *Attorney, Agent, or Firm*—Finnegan, Henderson, Farabow, Garrett & Dunner, L.L.P.

(57) ABSTRACT

A semiconductor device includes an isolation region, a semiconductor element region defined by the isolation region, and having a channel forming portion and a recessed portion, the recessed portion being formed between the isolation region and the channel forming portion, and an epitaxial semiconductor portion formed in the recessed portion, wherein the semiconductor element region has a wall portion between the isolation region and the epitaxial semiconductor portion.

13 Claims, 10 Drawing Sheets

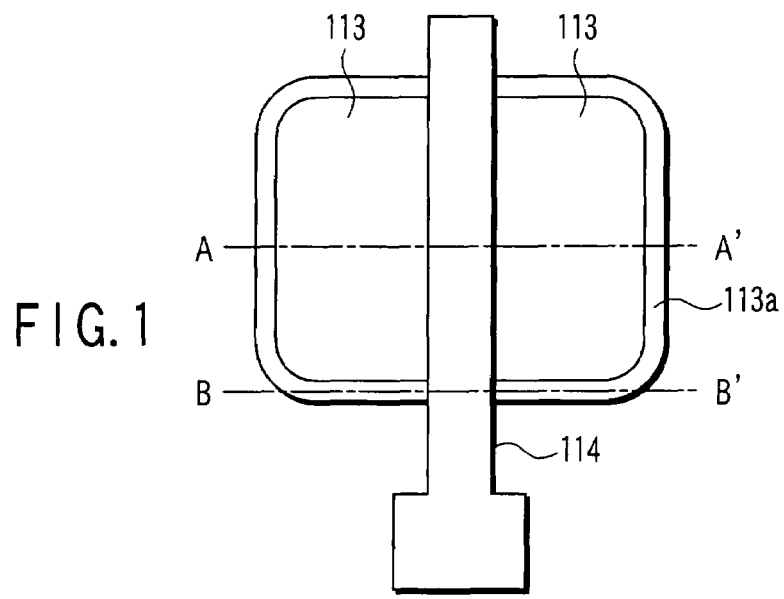
F I G. 1
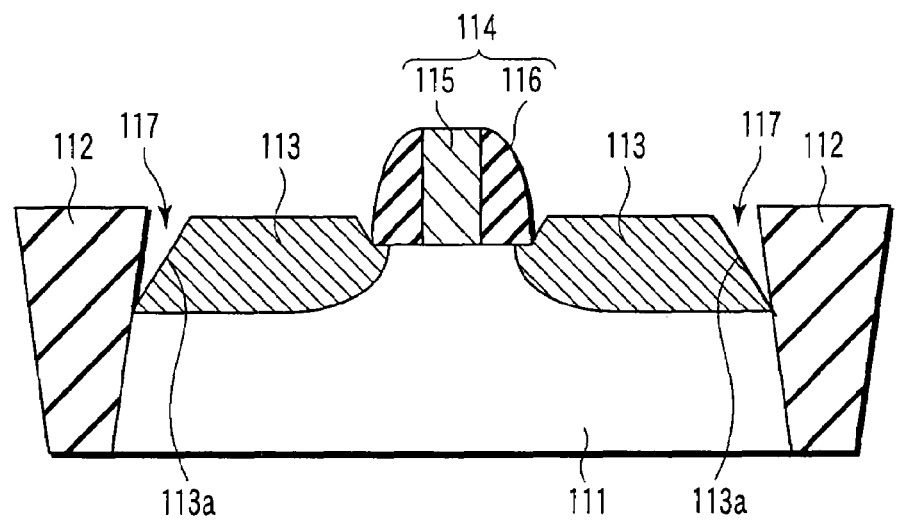
F I G. 2A
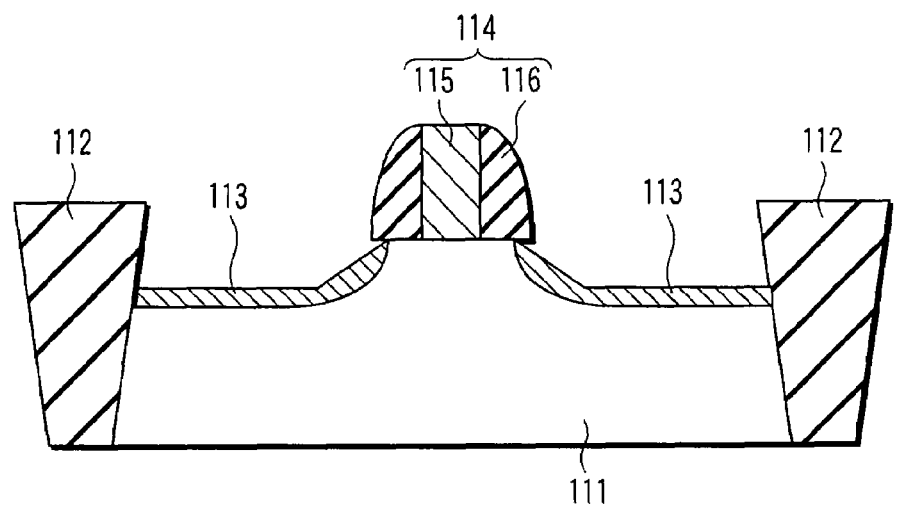
F I G. 2B

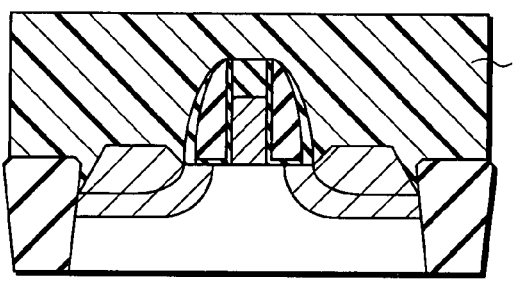
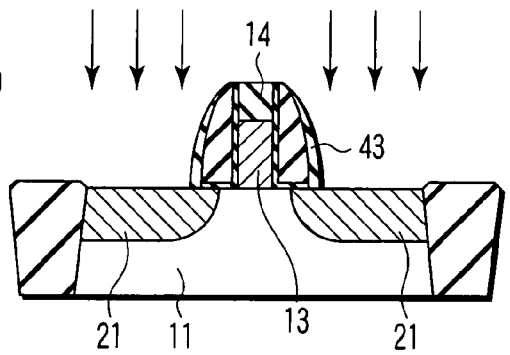
F I G. 26A    F I G. 26B
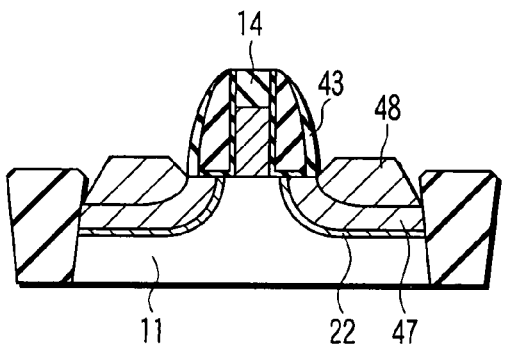
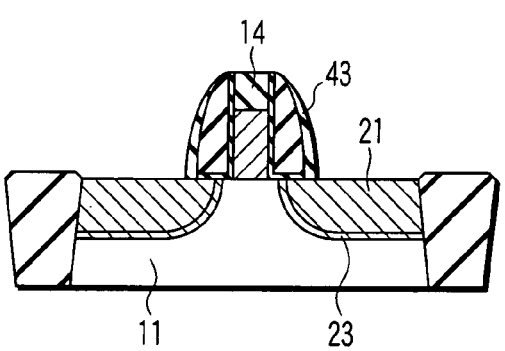
F I G. 27A    F I G. 27B
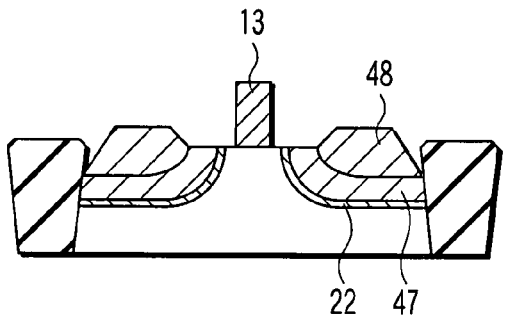
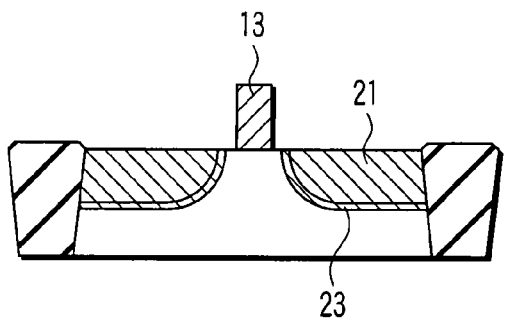
F I G. 28A    F I G. 28B
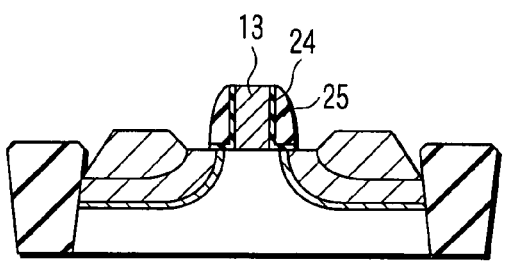
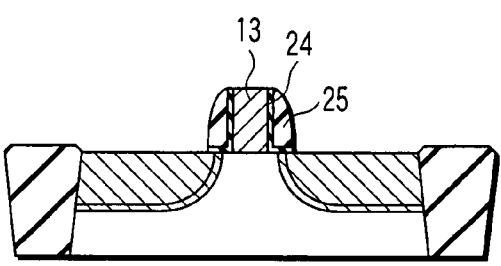
F I G. 29A    F I G. 29B

US 7,652,328 B2

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2006-038249, filed Feb. 15, 2006, the entire contents of which are incorporated herein by reference.

BACKGROUND OF THE INVENTION

1. Field of the Invention

The present invention relates to a semiconductor device and a method of manufacturing the same.

2. Description of the Related Art

Recently, techniques of increasing the channel mobility of a MIS transistor by providing strain to a channel region of the MIS transistor have been received much attention. As one of these techniques, proposed is a method in which a region for forming a source/drain region of a silicon substrate is etched to form a recessed portion, and an epitaxial SiGe layer is formed in the recessed portion (refer to U.S. Pat. No. 6,621,131). SiGe has a lattice constant larger than that of silicon, and thus an epitaxial SiGe layer can apply stress to a channel region. Therefore, strain is provided to a channel region, and the channel mobility of the MIS transistor is increased.

However, the above techniques have the following problems. The problems are explained with reference to FIG. 1 and FIGS. 2A and 2B. FIG. 1 is a plan view, FIG. 2A is a cross-sectional view taken along line A-A' of FIG. 1, and FIG. 2B is a cross-sectional view taken along line B-B' of FIG. 1.

In FIG. 1 and FIGS. 2A and 2B, reference numeral 111 denotes a silicon substrate, reference numeral 112 denotes an isolation region, reference numeral 113 denotes an epitaxial SiGe layer serving as a source/drain, reference numeral 114 denotes a gate structure formed of a gate insulating film (not shown), a gate electrode 115 and side wall spacers 116.

The epitaxial SiGe layer 113 is obtained by forming SiGe in a recessed portion formed in a silicon substrate by selective epitaxial growth. Under epitaxial growth conditions with high selectivity, the SiGe layer 113 is formed only on exposed surfaces of the silicon substrate 111. Therefore, as shown in FIG. 2A, the SiGe layer 113 is not formed on the side surfaces of the isolation regions 112, and a facet 113a is formed in the SiGe layer 113. As a result, a gap 117 is formed between the isolation region 112 and the epitaxial SiGe layer 113. With the gap 117, when a silicide is formed on the epitaxial SiGe layer 113, the silicide is formed also on the facet 113a. Since the silicide formed on the facet 113a is very close to the silicon substrate 111, it causes the problem of deterioration in junction leakage property. Further, the facet reduces an effective channel width, and thus also causes the problem of deterioration in the transistor property.

The above problems may be caused not only when an SiGe layer is formed in a recessed portion of a silicon substrate by epitaxial growth, but also when generally a semiconductor layer is formed in a recessed portion of a semiconductor substrate by epitaxial growth.

As described above, in prior art, there is the problem that properties of the transistor is deteriorated due to a facet formed in an epitaxial semiconductor portion when the epitaxial semiconductor portion is formed in a recessed portion of a semiconductor substrate (semiconductor element region).

BRIEF SUMMARY OF THE INVENTION

A first aspect of the present invention, there is provided a semiconductor device comprising: an isolation region; a semiconductor element region defined by the isolation region, and having a channel forming portion and a recessed portion, the recessed portion being formed between the isolation region and the channel forming portion; and an epitaxial semiconductor portion formed in the recessed portion, wherein the semiconductor element region has a wall portion between the isolation region and the epitaxial semiconductor portion.

A second aspect of the present invention, there is provided a semiconductor device comprising: an isolation region; a semiconductor element region defined by the isolation region, and having a channel forming portion and a recessed portion, the recessed portion being formed between the isolation region and the channel forming portion; and an epitaxial semiconductor portion formed in the recessed portion, and including a lower epitaxial portion and an upper epitaxial portion, the lower epitaxial portion being formed in a conformal manner on a bottom surface of the recessed portion and being in contact with the isolation region, the upper epitaxial portion being formed on the lower epitaxial portion and having a facet.

A third aspect of the present invention, there is provided a semiconductor device comprising: an isolation region; a semiconductor element region defined by the isolation region, and having a channel forming portion and a recessed portion, the recessed portion being formed between the isolation region and the channel forming portion; an epitaxial semiconductor portion formed on a bottom surface of the recessed portion in a conformal manner, and being in contact with the isolation region; and a stress generating film covering the epitaxial semiconductor portion and applying stress to the channel forming portion.

A fourth aspect of the present invention, there is provided a method of manufacturing a semiconductor device, comprising: forming an isolation region and a semiconductor element region defined by the isolation region; subjecting a part of the semiconductor element region to anisotropic etching to form a channel forming portion, a recessed portion located between the isolation region and the channel forming portion, and a wall portion located between the isolation region and the recessed portion; and forming an epitaxial semiconductor portion in the recessed portion.

A fifth aspect of the present invention, there is provided a method of manufacturing a semiconductor device, comprising: forming an isolation region and a semiconductor element region defined by the isolation region; subjecting a part of the semiconductor element region to isotropic etching to form a channel forming portion and a recessed portion located between the isolation region and the channel forming portion; forming a lower epitaxial portion on a bottom surface of the recessed portion in a conformal manner, the lower epitaxial portion being in contact with the isolation region; and forming an upper epitaxial portion having a facet on the lower epitaxial portion.

A sixth aspect of the present invention, there is provided a method of manufacturing a semiconductor device, comprising: forming an isolation region and a semiconductor element region defined by the isolation region; subjecting a part of the semiconductor element region to isotropic etching to form a channel forming portion and a recessed portion located between the isolation region and the channel forming portion; forming an epitaxial semiconductor portion on a bottom surface of the recessed portion in a conformal manner, the epitaxial semiconductor portion being in contact with the isolation region; and forming a stress generating film covering the epitaxial semiconductor portion and applying stress to the channel forming portion.

BRIEF DESCRIPTION OF THE SEVERAL VIEWS OF THE DRAWING

FIG. 1 is a schematic plan view of a structure of a semiconductor device according to prior art.

FIGS. 2A and 2B are schematic cross-sectional views of the structure of the semiconductor device according to prior art.

FIGS. 3A and 3B to FIGS. 12A and 12B are schematic cross-sectional views of a manufacturing process of a semiconductor device according to a first embodiment of the present invention.

FIGS. 20A and 20B to FIGS. 31A and 31B are schematic cross-sectional views of a manufacturing process of a semiconductor device according to a fourth embodiment of the present invention.

DETAILED DESCRIPTION OF THE INVENTION

Embodiments of the present invention are explained below with reference to drawings.

EMBODIMENT 1

FIGS. 3A and 3B to FIGS. 12A and 12B are schematic cross-sectional views of a manufacturing process of a semiconductor device according to a first embodiment. FIGS. 3A to 12A are cross-sectional views of a p-type MIS transistor region thereof, and FIGS. 3B to 12B are cross-sectional views of an n-type MIS transistor region thereof.

Figure 3A:
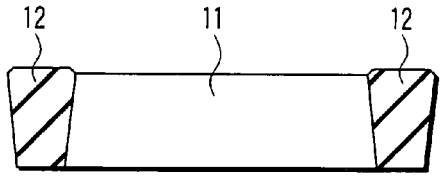
Figure 3B:
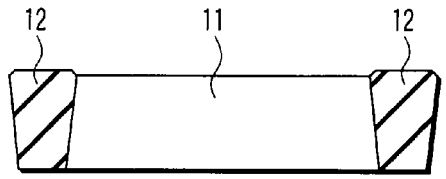

First as shown in FIGS. 3A and 3B, an isolation trench is formed in a silicon substrate (semiconductor substrate), and the isolation trench is filled with an insulating film such as a silicon oxide film. Thereby, formed are STI (shallow trench isolation) type isolation regions 12, and a semiconductor element region (semiconductor device region) 11 surrounded by the isolation regions 12.

Figure 4A:
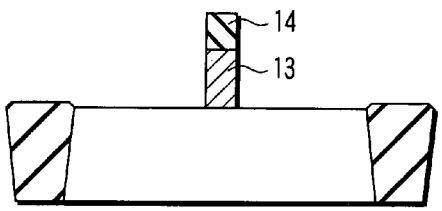
Figure 4B:
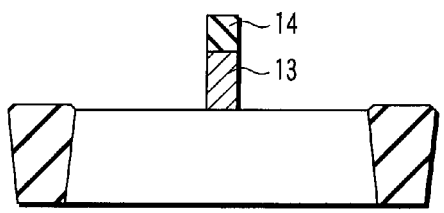

Next, as shown in FIGS. 4A and 4B, a gate insulating film (not shown), a gate electrode 13 and a protective portion 14 are formed on the element region 11. Specifically, a gate insulating film, a gate electrode film and a protective film are formed on the element region 11, and a photoresist pattern is formed on the protective film. With the photoresist pattern used as a mask, the gate insulating film, the gate electrode film and the protective film are etched by RIE (reactive ion etching), and thereby the gate insulating film (not shown), the gate electrode 13 and the protective portion 14 are formed. The gate electrode 13 is formed of a polysilicon film, and the protective portion 14 is formed of a silicon nitride film.

Figure 5A:
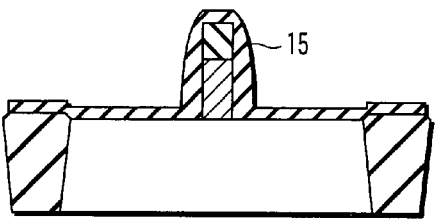
Figure 5B:
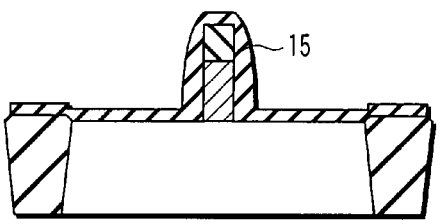

Then, as shown in FIGS. 5A and 5B, a silicon oxide film 15 using TEOS is formed on the whole surface. A silicon nitride film may be used instead of the silicon oxide film 15 using TEOS.

Figure 6A:
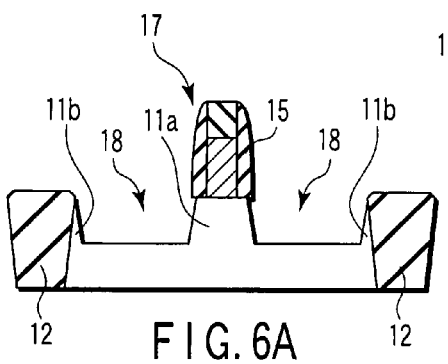
Figure 6B:
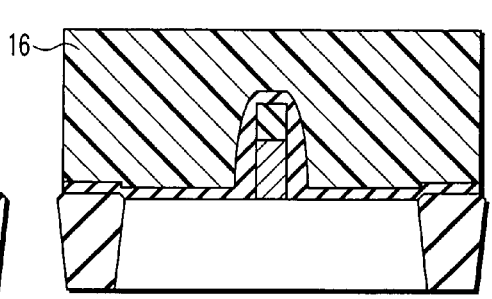

Next, as shown in FIGS. 6A and 6B, a photoresist pattern 16 covering the n-type MIS transistor region is formed. Then, the silicon oxide film 15 in the p-type MIS transistor region is subjected to anisotropic etching by RIE (reactive ion etching), and thereby side wall spacers 15 are formed on side surfaces of the gate electrode 13 and the protective portion 14. Thereby, a gate structure 17 is obtained. The gate structure 17 is formed of the gate insulating film (not shown), the gate electrode 13, the protective portion 14 and the side wall spacers 15. Further, the semiconductor element region 11 is subjected to anisotropic etching by RIE. A mixture gas of $Cl_2$ and $O_2$ or a mixture gas of $Cl_2$ and HBr can be used for the anisotropic etching. By the anisotropic etching, a channel forming portion 11a is formed under the gate structure 17, and recessed portions 18 are formed between the channel forming portion 11a and the respective isolation regions 12. Further, since the recessed portions 18 are formed by anisotropic etching, wall portions 11b are formed between the respective isolation regions 12 and the respective recessed portions 18. Specifically, a tapered wall portion 11b is formed on a side surface of each of the isolation regions 12. The thickness of the wall portion 11b is gradually reduced from the bottom toward the top, and an inclination angle of the side surface of the wall portion 11b is 90° or less.

Figure 7A:
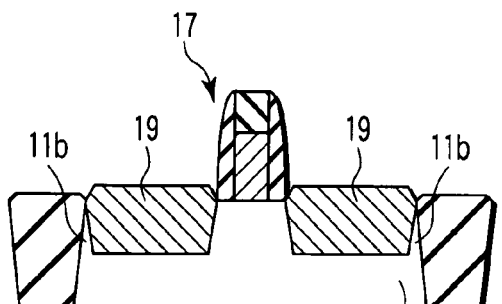
Figure 7B:
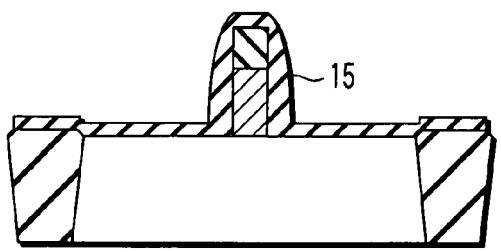

Next, as shown in FIGS. 7A and 7B, the photoresist pattern 16 is removed, and thereafter a native oxide film (not shown) formed on the surface of the semiconductor element region 11 is removed. Then, an SiGe layer (epitaxial semiconductor portion) 19 doped with boron (B) is formed in the recessed portions 18 by selective epitaxial growth. Since SiGe has a lattice constant greater than that of silicon, the epitaxial SiGe layer 19 can provide stress to the channel forming portion 11a. As a result, strain is provided to the channel region, and the channel mobility of the MIS transistor is increased. Since the wall portions 11b are formed on the side surfaces of the isolation regions 12 in selective epitaxial growth of SiGe, epitaxial growth occurs also from the wall portions 11b. Therefore, no deep gaps 117 (refer to FIGS. 2A and 2B) as in the prior art are formed between the isolation regions 12 and the SiGe layer 19. Therefore, no large facets 113a (refer to FIGS. 2A and 2B) as in the prior art are formed.

Figure 8A:
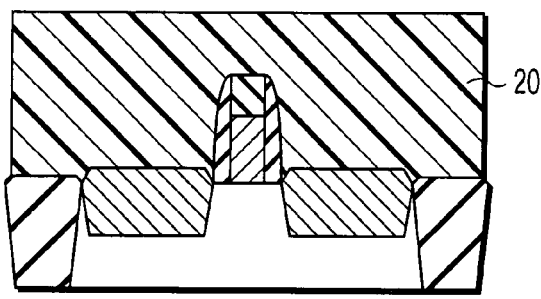
Figure 8B:
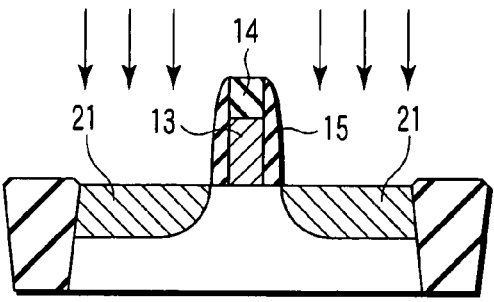

Next, as shown in FIGS. 8A and 8B, a photoresist pattern 20 covering the p-type MIS transistor region is formed. Then, the silicon oxide film 15 in the n-type MIS transistor region is subjected to anisotropic etching by RIE, and thereby side wall spacers 15 are formed on side surfaces of the gate electrode 13 and the protective portion 14. Further, with the gate electrode 13, the protective portion 14 and the side wall spacers 15 used as a mask, an n-type impurity (phosphorus (P) or arsenic (As)) was ion-implanted into the semiconductor element region 11 in the n-type MIS transistor region, and thereby an ion implantation layer 21 is formed.

Figure 9A:
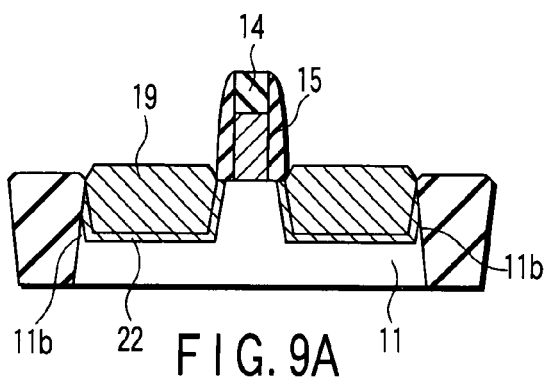
Figure 9B:
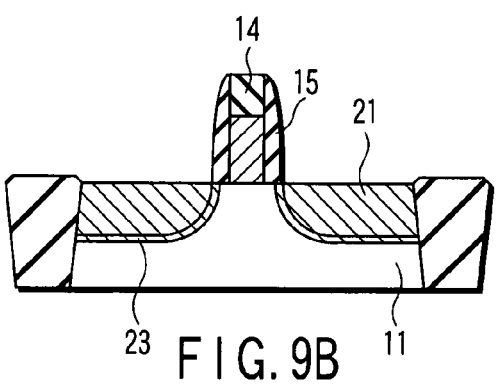

Next, as shown in FIGS. 9A and 9B, the photoresist pattern 20 is removed, and thereafter activation anneal of the impurity is performed. Thereby, p-type impurity (B) contained in the SiGe layer 19 and the n-type impurity (P or As) contained in the ion-implantation layer 21 are activated, and the source/drain regions are formed. Further, in the activation anneal, the p-type impurity (B) contained in the SiGe layer 19 in the p-type MIS transistor region is diffused into the semiconductor element region (silicon substrate) 11, and a p-type impurity layer 22 is formed. The p-type impurity concentration of the p-type impurity layer 22 is set to be almost the same as the p-type impurity concentration of the SiGe layer 19. Further, in the n-type MIS transistor region, the n-type impurity (P or As) contained in the ion implantation layer 21 is diffused into the semiconductor element region (silicon substrate) 11, and an n-type impurity layer 23 is formed. In the p-type MIS transistor region, the p-type impurity is also diffused into the wall portions 11b, and form the p-type impurity layer 22. Since the wall portions 11b is thin (the width is small) and the thickness of the wall portions 11b is gradually reduced from the bottom toward the top, at least the upper portions of the wall portions 11b are occupied by the p-type impurity layer 22.

Figure 10A:
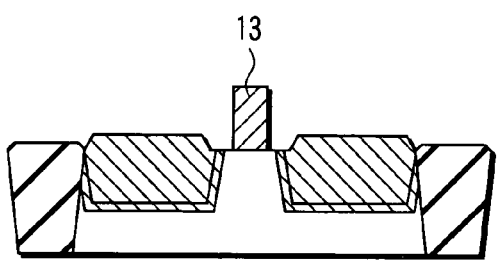
Figure 10B:
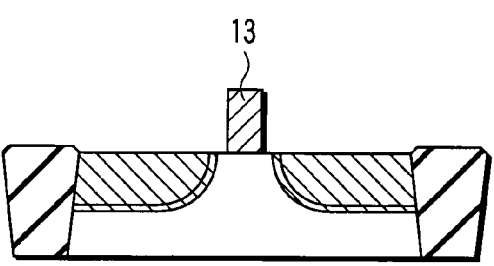
Figure 11A:
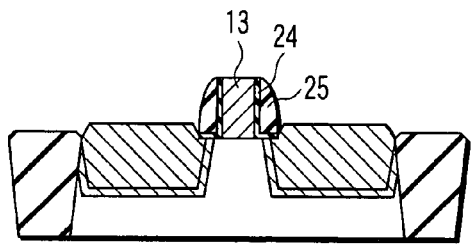
Figure 11B:
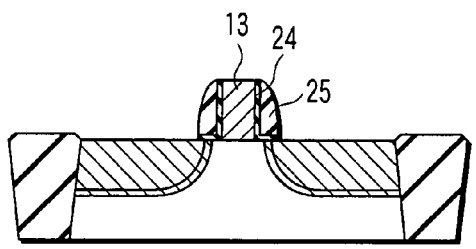

Next, as shown in FIGS. 10A and 10B, the protective portion 14 and the side wall spacers 15 are removed, and thereby the gate electrode 13 is exposed. Then, extension regions of the source-drain regions are formed. Thereafter, as shown in FIGS. 11A and 11B, a silicon oxide film (TEOS silicon oxide film) 24 and a silicon nitride film 25 are formed on side surfaces of the exposed gate electrode 13.

Figure 12A:
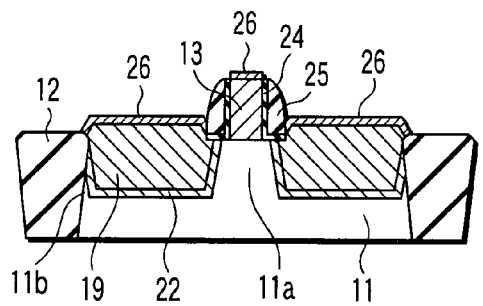
Figure 12B:
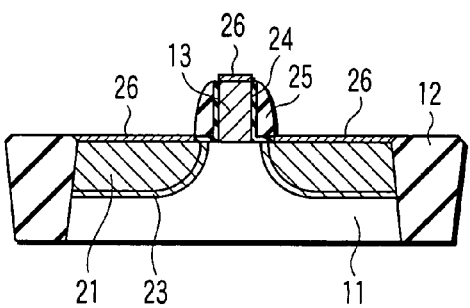

Next, as shown in FIGS. 12A and 12B, a silicide film 26 (a salicide (self aligned silicide) film) is formed in a self-aligned manner on the exposed surfaces of the gate electrode (polysilicon film) 13, the SiGe layer 19 and the ion implantation layer 21. For example, Ni silicide can be used as the silicide film 26. Thereby, obtained is a semiconductor device in which the epitaxial SiGe layer 19 is used as the source and drain in the p-type MIS transistor and the ion implantation layer 21 is used as the source and drain in the n-type MIS transistor.

As described above, according to the first embodiment, the wall portions 11b are formed on side surfaces of the isolation regions 12. Therefore, no deep gaps 117 (refer to FIGS. 2A and 2B) as in the prior art are formed between the isolation regions 12 and the epitaxial SiGe layer 19, and no large facets 113a (refer to FIGS. 2A and 2B) are formed. Further, since the wall portions 11b is thin (the width is small), and the thickness of the wall portions 11b is reduced from the bottom toward the top, at least the upper portions of the wall portions 11b are occupied by the p-type impurity layer 22. Therefore, the distance between the silicide film (conductive portion) 26 and the pn junction interface is increased, and thus deterioration in the junction leakage property is prevented. Further, since no large facets as in the prior art are formed, the problem of decrease in the effective channel width due to facets is prevented. Therefore, according to the first embodiment, it is possible to prevent deterioration in property due to facets, and obtain a semiconductor device having excellent properties.

EMBODIMENT 2

FIGS. 13 to 16 are schematic cross-sectional views of a manufacturing process of a semiconductor device according to a second embodiment. The basic structure and the basic manufacturing method of the second embodiment are the same as those of the first embodiment, and thus explanation of the matters which have been explained in the first embodiment is omitted. Further, for simple explanation, only a manufacturing process in the p-type MIS transistor region is illustrated in the second embodiment.

Figure 13:
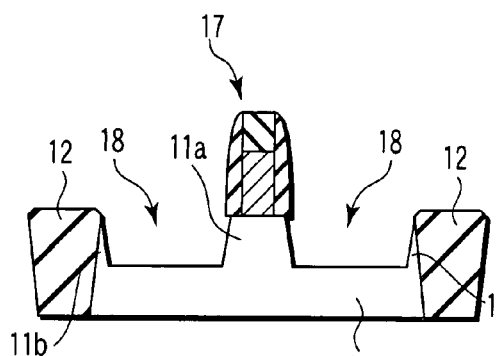
FIGS. 13 to 16 are schematic cross-sectional views of a manufacturing process of a semiconductor device according to a second embodiment of the present invention.

First, the steps illustrated in FIGS. 3A and 3B to FIGS. 6A and 6B are performed in the same manner as in the first embodiment, and thereby a structure illustrated in FIG. 13 is formed. Also in the second embodiment, wall portions 11b are formed on side surfaces of the isolation regions 12 as in the first embodiment.

Figure 14:
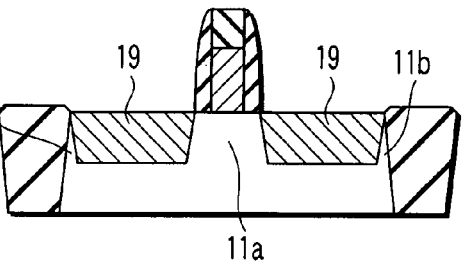

Next, as shown in FIG. 14, an SiGe layer (lower epitaxial portions) 19 doped with boron (B) is formed in the recessed portions 18 as in the first embodiment. However, in the second embodiment, the SiGe layer 19 is formed to be as high as the upper surface of the channel forming portion 11a.

Figure 15:
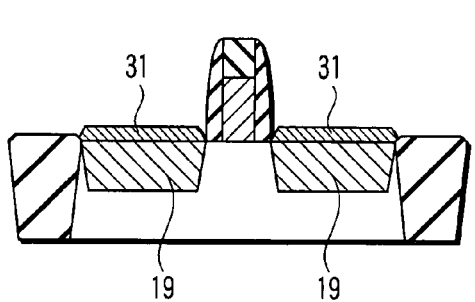

Then, as shown in FIG. 15, an Si epitaxial layer (upper epitaxial portions) 31 is formed on the SiGe layer 19 by selective epitaxial growth. The Si epitaxial layer 31 may be doped with boron (B). Thereafter, the same steps as illustrated in FIGS. 8A and 8B to FIGS. 11A and 11B in the first embodiment are performed.

Figure 16:
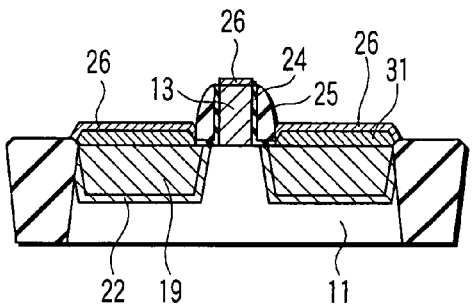

Next, as shown in FIG. 16, a silicide film (salicide film) 26 is formed in a self-aligned manner on the exposed surfaces of the gate electrode 13 and the Si layer 31. Thereby, a semiconductor device as shown in FIG. 16 is obtained.

Also in the second embodiment, the wall portions 11b are formed, and thereby a semiconductor device with excellent properties is obtained as in the first embodiment. Further, in the second embodiment, the Si epitaxial layer 31 is formed as the upper epitaxial portions. Therefore, it is possible to form a silicide film 26 with a better quality than in the case of forming a silicide film 26 on the surface of the SiGe layer.

EMBODIMENT 3

Figure 17:
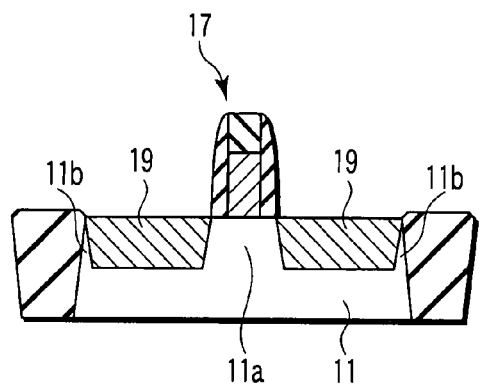
FIGS. 17 to 19 are schematic cross-sectional views of a manufacturing process of a semiconductor device according to a third embodiment of the present invention.
Figure 18:
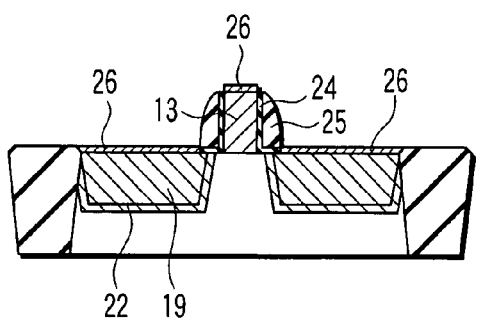
Figure 19:
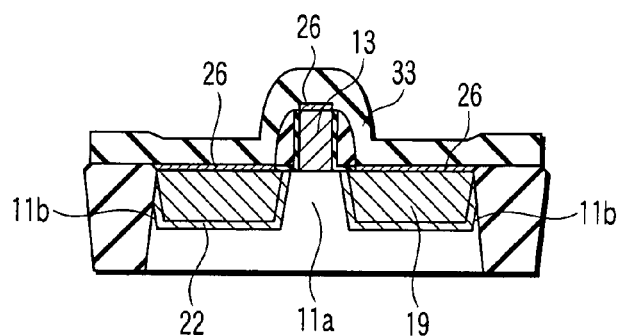

FIGS. 17 to 19 are schematic cross-sectional views of a manufacturing process of a semiconductor device according to a third embodiment. The basic structure and the basic manufacturing method of the third embodiment are the same as those of the first embodiment, and thus explanation of the matters which have been explained in the first embodiment is omitted. Further, for simple explanation, only a manufacturing process in the p-type MIS transistor region is illustrated in the third embodiment.

First, the steps illustrated in FIGS. 3A and 3B to FIGS. 6A and 6B are performed in the same manner as in the first embodiment. Thereafter, as shown in FIG. 17, an SiGe layer 19 doped with boron (B) is formed in the recessed portions in the same manner as in the first embodiment. However, in the third embodiment, the SiGe layer 19 is formed to be as high as the upper surface of the channel forming portion 11a. Thereafter, the same steps illustrated in FIGS. 8A and 8B to FIGS. 11A and 11B of the first embodiment are performed.

Next, as shown in FIG. 18, a silicide film (salicide film) 26 is formed in a self-aligned manner on the exposed surfaces of the gate electrode 13 and the SiGe layer 19.

Next, as shown in FIG. 19, a stress liner film 33 covering the gate electrode 13, the SiGe layer 19 and the silicide film 26 is formed. The stress liner film 33 applies stress to the channel forming portion 11a. For example, a silicon nitride film can be used as the stress liner film 33. Thereby, a semiconductor device shown in FIG. 19 is obtained.

Also in the third embodiment, the wall portions 11b are formed, and thereby a semiconductor device with excellent properties is obtained as in the first embodiment. Further, in the third embodiment, both the SiGe layer 19 and the stress liner film 33 apply stress to the channel forming portion 11a. Therefore, a larger stress is applied to the channel forming portion 11a, and thus the channel mobility of the MIS transistor is effectively increased.

Figure 43:
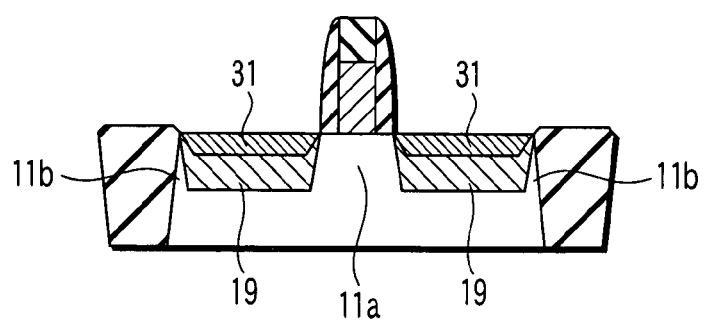
FIG. 43 is a schematic cross-sectional view of a structure of a modification of the semiconductor devices according to the first to third embodiment.

In the above first to third embodiment, the upper surface of the epitaxial SiGe layer 19 is higher than or as high as the upper surface of the channel forming portion 11a. However, as shown in FIG. 43, the upper surface of the SiGe layer 19 may be lower than the upper surface of the channel forming portion 11a. Further, if the epitaxial Si layer 31 is formed on the epitaxial SiGe layer 19, the upper surface of the epitaxial Si layer 31 may be as high as the upper surface of the channel forming portion 11a. Further, the upper surface of the epitaxial Si layer 31 may be higher than or lower than the upper surface of the channel forming portion 11a.

EMBODIMENT 4

FIGS. 20A and 20B to FIGS. 31A and 31B are schematic cross-sectional views of a manufacturing process of a semiconductor device according to a fourth embodiment. FIGS. 20A to 31A are cross-sectional views of a p-type MIS transistor region thereof, and FIGS. 20B to 31B are cross-sectional views of an n-type MIS transistor region thereof.

Figure 20A:
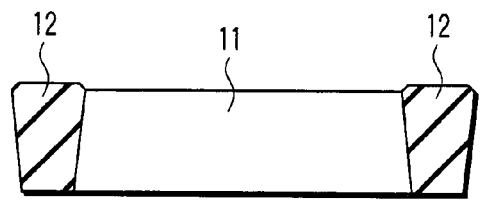
Figure 20B:
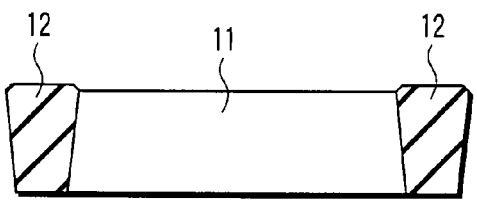

First, as shown in FIGS. 20A and 20B, an isolation trench is formed in a silicon substrate (semiconductor substrate), and the isolation trench is filled with an insulating film such as a silicon oxide film. Thereby, formed are STI type isolation regions 12, and a semiconductor element region 11 surrounded by the isolation regions 12.

Figure 21A:
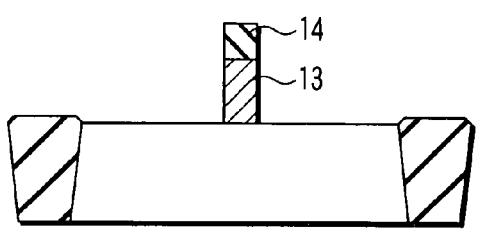
Figure 21B:
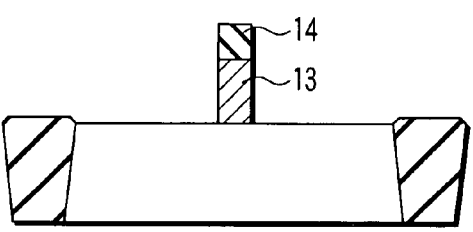

Next, as shown in FIGS. 21A and 21B, a gate insulating film (not shown), a gate electrode 13 and a protective portion 14 are formed on the element region 11. The gate electrode 13 is formed of a polysilicon film, and the protective portion 14 is formed of a silicon nitride film.

Figure 22A:
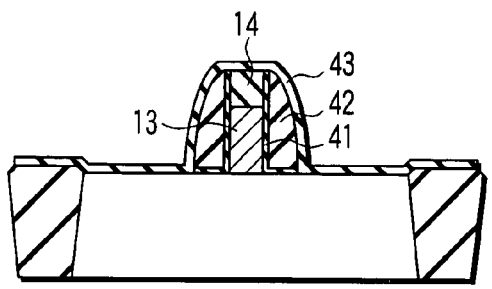
Figure 22B:
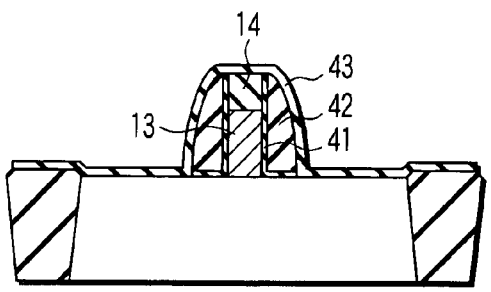

Then, as shown in FIGS. 22A and 22B, side wall spacers comprising a silicon oxide film 41a silicon nitride film 42 are formed on side surfaces of the gate electrode 13 and the protective portion 14. Further, a silicon oxide film 43 using TEOS is formed on the whole surface. A single-layer silicon nitride film may be formed on the side surfaces of the gate electrode 13 and the protective portion 14, or a single-layer TEOS silicon oxide film may be formed.

Figure 23A:
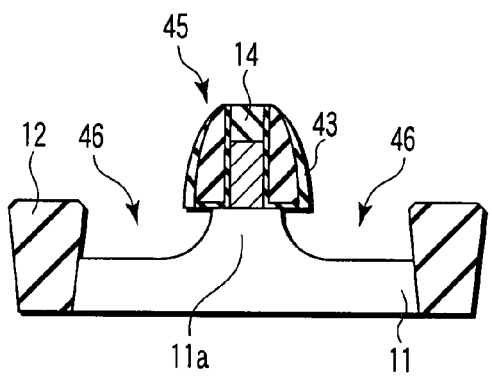
Figure 23B:
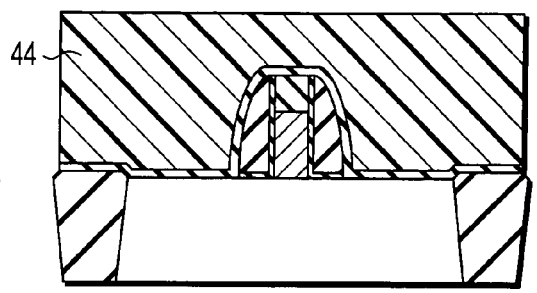

Next, as shown in FIGS. 23A and 23B, a photoresist pattern 44 covering the n-type MIS transistor region is formed. Then, the silicon oxide film 43 in the p-type MIS transistor region is subjected to anisotropic etching. Thereby, a gate structure 45 is obtained. The gate structure 45 is formed of the gate insulating film (not shown), the gate electrode 13, the protective portion 14, the silicon oxide film 41, the silicon nitride film 42 and the silicon oxide film 43. Then, the semiconductor element region 11 is subjected to isotropic etching. For example, a mixture gas of $SF_6$ and $NF_3$ can be used for the isotropic etching. By the isotropic etching, a channel forming portion 11a is formed under the gate structure 45, and recessed portions 46 are formed between the channel forming portion 11a and the respective isolation regions 12.

Figure 24A:
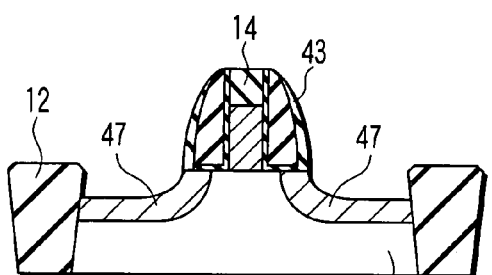
Figure 24B:
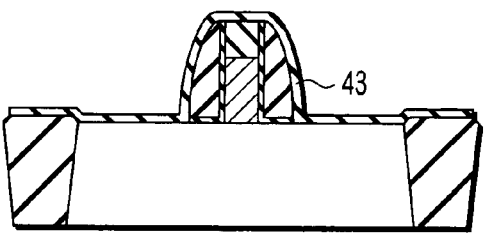

Next, as shown in FIGS. 24A and 24B, the photoresist pattern 44 is removed, and thereafter a native oxide film (not shown) formed on the surface of the semiconductor element region 11 is removed. Then, an SiGe layer (lower epitaxial portions) 47 doped with boron (B) is formed in the recessed portions 46 by conformal epitaxial growth. Film formation of the SiGe layer 47 is performed until the surface of the SiGe layer 47 is aligned with the surface of the silicon oxide film 43 of the side wall spacers. Thereby, the SiGe layer 47 is formed with almost uniform thickness on the bottom surfaces of the recessed portions 46 (exposed surface of the semiconductor element region 11). Further, since conformal epitaxial growth conditions are used, no facets are formed in the SiGe layer 47. Therefore, the SiGe layer 47 is in contact with the side surfaces of the isolation regions 12. Under conformal epitaxial growth conditions, the selectivity of epitaxial growth is relatively low. However, since formation of the SiGe layer 47 is finished when the SiGe layer 47 still has a small thickness, the SiGe layer 47 can be selectively formed only on the exposed surface of the semiconductor element region 11.

Figure 25A:
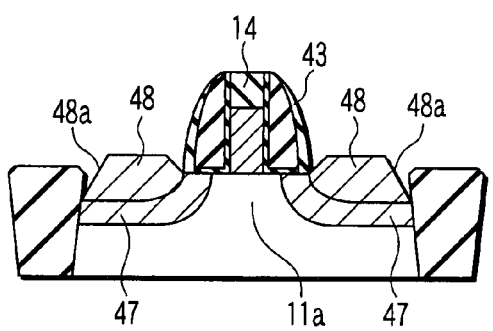
Figure 25B:
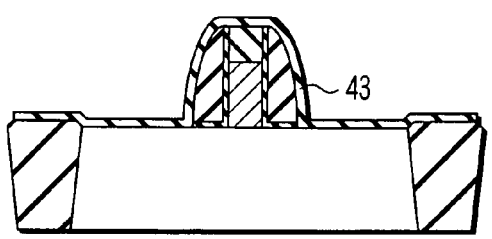

Next, as shown in FIGS. 25A and 25B, SiGe layer (upper epitaxial portions) 48 doped with boron (B) is formed on the SiGe layer 47 under highly-selective epitaxial conditions. Since the SiGe layer 48 is formed under highly-selective epitaxial conditions, facets 48a are formed in the SiGe layer 48.

As described above, epitaxial semiconductor portions formed of the SiGe layers 47 and 48 are formed. SiGe has a lattice constant larger than that of silicon, and thus the epitaxial SiGe layers 47 and 48 can apply stress to the channel forming portion 11a. Consequently, strain is provided to the channel region, and the channel mobility of the MIS transistor is increased.

Both of the SiGe layers 47 and 48 are formed by using silicon (Si) source gas and germanium (Ge) source gas. Partial pressure of one of the Si source gas and the Ge source gas, which has a higher gas decomposition temperature, is increased and the total pressures of the Si source gas and the Ge source gas are increased. Thereby, epitaxial growth conditions with relatively low selectivity (conformal epitaxial growth conditions) are obtained. In the reverse case, epitaxial growth conditions with relatively high selectivity (epitaxial growth conditions with which facets are formed) are obtained.

Next, as shown in FIGS. 26A and 26B, a photoresist pattern 49 covering the p-type MIS transistor region is formed. Then, the silicon oxide film 43 in the n-type MIS transistor region is subjected to anisotropic etching by RIE, and thereby side wall spacers including the silicon oxide film 43 is formed. Further, with the side wall spacers formed as described above used as a mask, n-type impurity (phosphorus (P) or arsenic (As)) is ion-implanted into the semiconductor element region 11 of the n-type MIS transistor region, and thereby an ion implantation layer 21 is formed.

Next, as shown in FIGS. 27A and 27B, the photoresist pattern 49 is removed, and thereafter activation anneal of the impurity is performed. Thereby, the p-type impurity (B) contained in the SiGe layers 47 and 48 and the n-type impurity (P or As) contained in the ion-implantation layer 21 are activated, and the source/drain regions are formed. Further, in the activation anneal, the p-type impurity (B) contained in the SiGe layers 47 and 48 in the p-type MIS transistor region is diffused into the semiconductor element region (silicon substrate) 11, and a p-type impurity layer 22 is formed. Further, in the n-type MIS transistor region, the n-type impurity (P or As) contained in the ion implantation layer 21 is diffused into the semiconductor element region (silicon substrate 11), and an n-type impurity layer 23 is formed.

Next, as shown in FIGS. 28A and 28B, the protective portion 14 and the side wall spacers formed around the gate electrode 13 are removed, and thereby the gate electrode 13 is exposed. Then, extension regions of the source-drain regions are formed. Thereafter, as shown in FIGS. 29A and 29B, a silicon oxide film (TEOS silicon oxide film) 24 and a silicon nitride film 25 are formed on side surfaces of the exposed gate electrode 13.

Figure 30A:
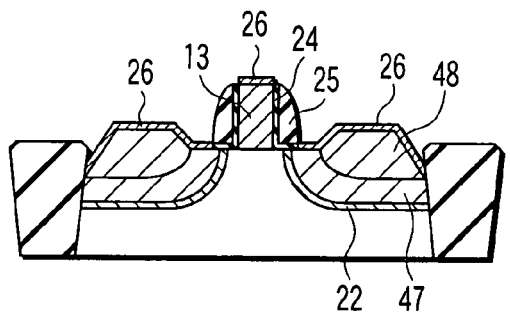
Figure 30B:
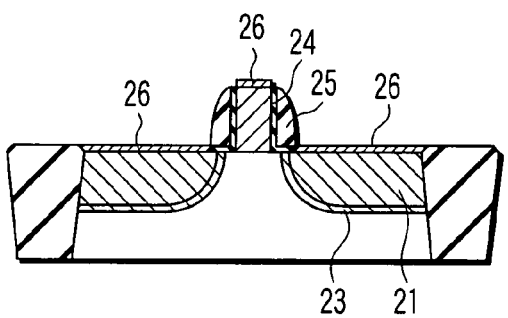

Next, as shown in FIGS. 30A and 30B, a silicide film (a salicide film) 26 is formed in a self-aligned manner on the exposed surfaces of the gate electrode (polysilicon film) 13, the SiGe layers 47 and 48 and the ion implantation layer 21. For example, Ni silicide can be used as the silicide film 26.

Figure 31A:
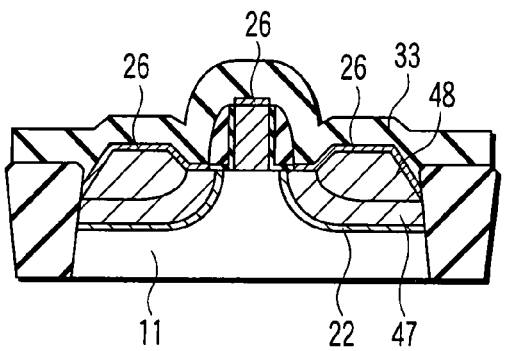
Figure 31B:
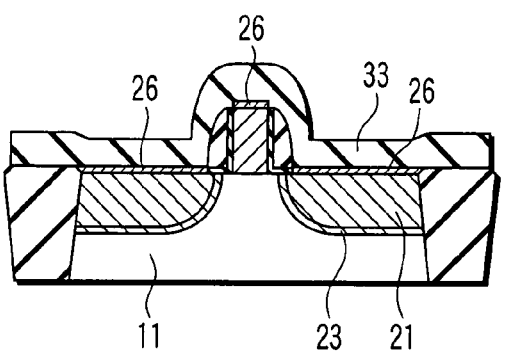

Next, as shown in FIGS. 31A and 31B, a stress liner film 33 is formed on the whole surface. The stress liner film 33 applies stress to the channel forming portion 11a. Thereby, obtained is a semiconductor device in which the epitaxial SiGe layers 47 and 48 are used as the source and drain in the p-type MIS transistor and the ion implantation layer 21 is used as the source and the drain in the n-type MIS transistor.

As described above, according to the fourth embodiment, the conformal epitaxial SiGe layer 47 is formed, and thereafter the epitaxial SiGe layer 48 is formed under highly-selective epitaxial conditions. Since the SiGe layer 47 is in contact with the side surfaces of the isolation regions 12, no problem is caused even if the SiGe layer 48 has facets 48a. Specifically, since the conformal SiGe layer 47 is formed under the SiGe layer 48, no deep gaps 117 (refer to FIGS. 2A and 2B) as in the prior art are formed between the isolation regions 12 and the epitaxial SeGe layers 47 and 48, and no large facets 113a (refer to FIGS. 2A and 2B) as in the prior art are formed. Therefore, the distance between the silicide film (conductive portion) 26 and the pn junction interface is increased, and thus deterioration in the junction leakage property is prevented. Further, since no large facets as in the prior art are formed, the problem of decrease in the effective channel width due to facets is prevented. Therefore, according to the fourth embodiment, it is possible to prevent deterioration in property due to facets, and obtain a semiconductor device having excellent properties.

EMBODIMENT 5

Figure 32:
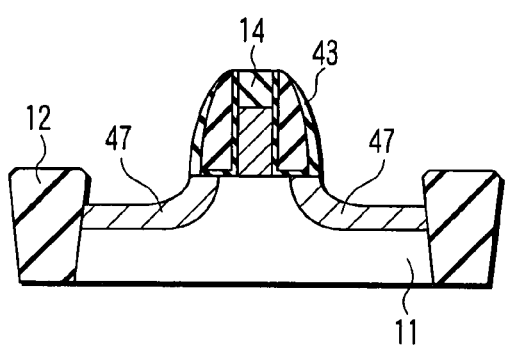
FIGS. 32 to 34 are schematic cross-sectional views of a manufacturing process of a semiconductor device according to a fifth embodiment of the present invention.
Figure 33:
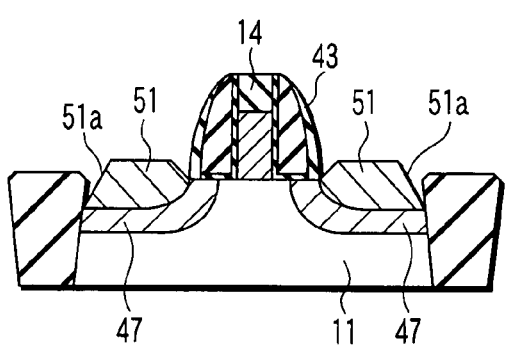
Figure 34:
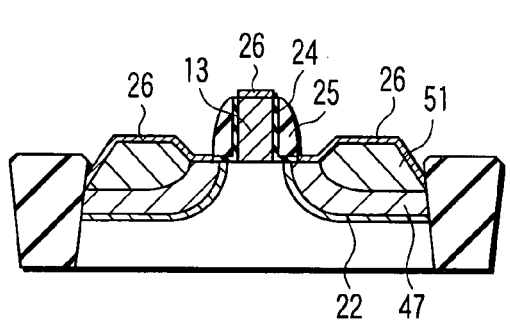

FIGS. 32 to 34 are schematic cross-sectional views of a manufacturing process of a semiconductor device according to a fifth embodiment. The basic structure and the basic manufacturing method of the fifth embodiment are the same as those of the fourth embodiment, and thus explanation of the matters which have been explained in the fourth embodiment is omitted. Further, for simple explanation, only a manufacturing process in the p-type MIS transistor region is illustrated in the fifth embodiment.

First, the steps illustrated in FIGS. 20A and 20B to FIGS. 24A and 24B are performed in the same manner as in the fourth embodiment, and thereby a structure illustrated in FIG. 32 is formed. Specifically, a conformal SiGe layer 47 is formed on the exposed surface of the semiconductor element region 11, in the same manner as in the fourth embodiment.

Next, as shown in FIG. 33, an Si epitaxial layer (upper epitaxial portions) 51 is formed on the SiGe layer 47 under highly-selective epitaxial conditions.

The Si epitaxial layer 51 may be doped with boron (B). Since the Si layer 51 is formed under highly-selective epitaxial conditions, facets 51a are formed in the Si layer 51. As described above, epitaxial semiconductor portions formed of the SiGe layer 47 and Si layer 51 are formed. Thereafter, the same steps as illustrated in FIGS. 26A and 26B to 29A and 29B of the fourth embodiment are performed.

Next, as shown in FIG. 34, a silicide film (salicide film) 26 is formed in a self-aligned manner on the exposed surfaces of the gate electrode (polysilicon film) 13, the SiGe layer 47 and the Si layer 51. Thereby, a semiconductor device as illustrated in FIG. 34 is obtained.

Also in the fifth embodiment, the conformal epitaxial SiGe layer 47 is formed, and thereby it is possible to obtain a semiconductor device having excellent properties as in the fourth embodiment. Further, in the fifth embodiment, the Si epitaxial layer 51 is formed as the upper epitaxial portions. Therefore, it is possible to form a silicide film 26 with a better quality than in the case of forming a silicide film 26 on the SiGe layer.

EMBODIMENT 6

Figure 35:
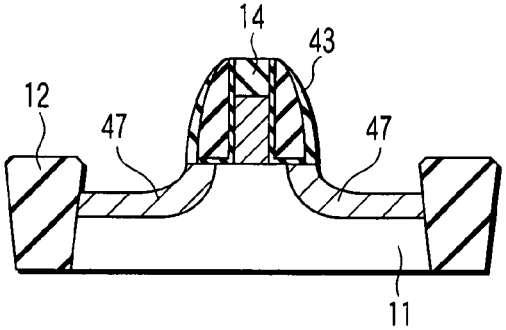
FIGS. 35 to 37 are schematic cross-sectional views of a manufacturing process of a semiconductor device according to a sixth embodiment of the present invention.
Figure 36:
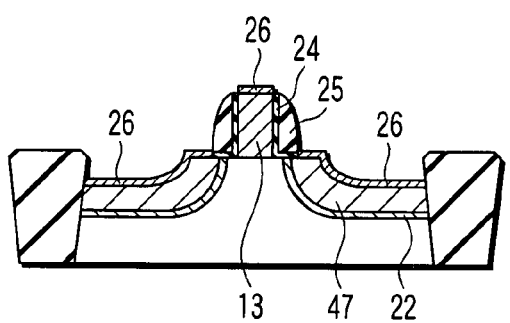
Figure 37:
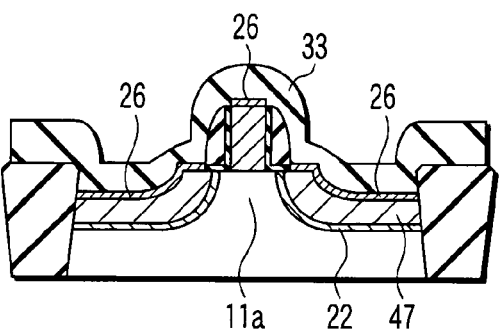

FIGS. 35 to 37 are schematic cross-sectional views of a manufacturing process of a semiconductor device according to a sixth embodiment. The basic structure and the basic manufacturing method of the sixth embodiment are the same as those of the fourth embodiment, and thus explanation of the matters which have been explained in the fourth embodiment is omitted. Further, for simple explanation, only a manufacturing process in the p-type MIS transistor region is illustrated in the sixth embodiment.

First, the steps illustrated in FIGS. 20A and 20B to FIGS. 24A and 24B are performed in the same manner as in the fourth embodiment, and thereby a structure illustrated in FIG. 35 is formed. Specifically, a conformal SiGe layer 47 is formed on the exposed surface of the semiconductor element region 11, in the same manner as in the fourth embodiment. Thereafter, the same steps as illustrated in FIGS. 26A and 26B to FIGS. 29A and 29B of the fourth embodiment are performed.

Next, as shown in FIG. 36, a silicide film (salicide film) 26 is formed in a self-aligned manner on the exposed surfaces of the gate electrode (polysilicon film) 13 and the SiGe layer 47.

Then, as shown in FIG. 37, a stress liner film 33 covering the gate electrode 13, the SiGe layer 47 and the silicide film 26 is formed. For example, a silicon nitride film can be used as the stress liner film 33. The stress liner film 33 functions as a stress generating film which applies stress to the channel forming portion 11a. Thereby, a semiconductor device as shown in FIG. 37 is obtained.

As described above, the sixth embodiment includes the conformal epitaxial SiGe layer 47. Therefore, as stated in the fourth embodiment, the distance between the silicide film (conductive portion) 26 and the pn junction interface is increased, and thus deterioration in the junction leakage property is prevented. Further, the problem of decrease in the effective channel width due to facets is prevented. Therefore, according to the sixth embodiment, it is possible to prevent deterioration in property due to facets, and obtain a semiconductor device having excellent properties.

Further, in the sixth embodiment, the stress liner film 33 is formed on the conformal epitaxial SiGe layer 47. Specifically, the epitaxial SiGe layer 47 has recessed portions based on the recessed portions of the semiconductor element region 11, and a part of the stress liner film 33 fills the recessed portions of the epitaxial SiGe layer 47. Therefore, the stress liner film 33 has a part located in a position lower than the upper surface of the channel forming portion 11a. Thus, the stress generated by the stress liner film 33 is sufficiently applied to the channel forming portion 11a. Consequently, the SiGe layer 47 works synergistically with the stress liner film 33, and they apply sufficient stress to the channel forming portion 11a. Therefore, according to the sixth embodiment, the channel mobility of the MIS transistor is effectively increased, and a semiconductor device with excellent properties is obtained.

EMBODIMENT 7

Figure 38A:
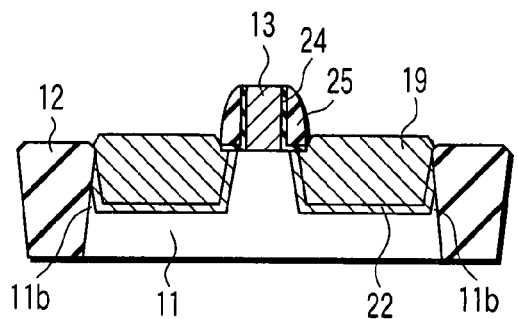
FIGS. 38A and 38B and FIGS. 39A and 39B are schematic cross-sectional views of a manufacturing process of a semiconductor device according to a seventh embodiment of the present invention.
Figure 38B:
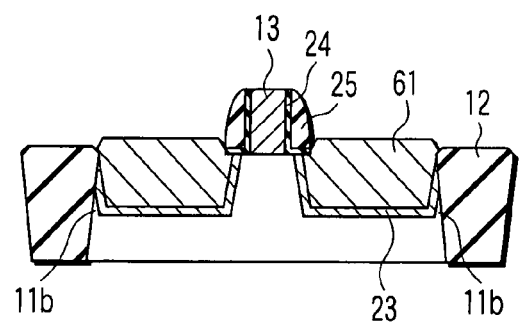
Figure 39A:
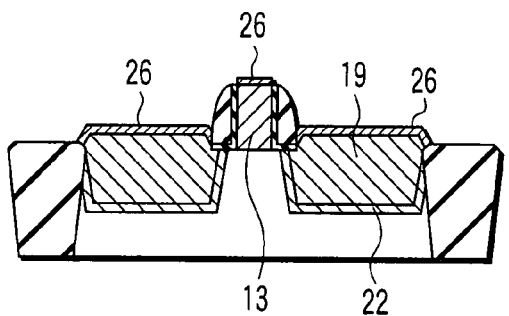
Figure 39B:
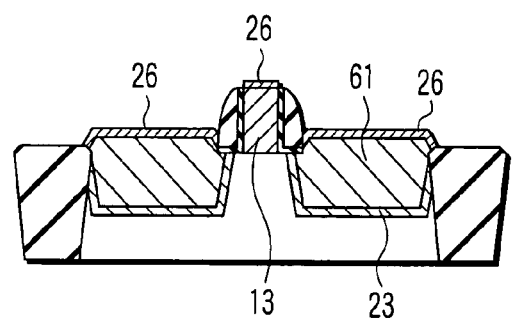

FIGS. 38A and 38B to FIGS. 39A and 39B are schematic cross-sectional views of a manufacturing process of a semiconductor device according to a seventh embodiment. FIGS. 38A and 39A are cross-sectional views of a p-type MIS transistor region thereof, and FIGS. 38B and 39B are cross-sectional views of an n-type MIS transistor region thereof. The basic structure and the basic manufacturing method of the seventh embodiment are the same as those of the first embodiment, and thus explanation of the matters which have been explained in the first embodiment is omitted.

In the first embodiment, the source and the drain of the p-type MIS transistor are formed of the epitaxial semiconductor portions (SiGe layer 19 doped with boron (B)), and the source and the drain of the n-type MIS transistor are formed of the ion implantation layer 21. In the seventh embodiment, as shown in FIGS. 38A and 38B, the source and the drain of the n-type MIS transistor are also formed of epitaxial semiconductor portions 61. The epitaxial semiconductor portions 61 are formed by selective epitaxial growth, like the epitaxial semiconductor portions 19. Further, Si doped with phosphorus (P) or arsenic (As) or SiC doped with phosphorus (P) or arsenic (As) is used as the epitaxial semiconductor portions 61. A silicide film 26 is formed on the gate electrode 13, the epitaxial semiconductor portions 19 and the epitaxial semiconductor portions 61, and thereby a semiconductor device as illustrated in the FIGS. 39A and 39B is formed.

In the seventh embodiment, wall portions 11b are formed on side surfaces of isolation regions 12 also in the n-type MIS transistor region as well as the p-type MIS transistor region. Therefore, deterioration in property due to facets is prevented also in the n-type MIS transistor region as well as in the p-type MIS transistor region, and a semiconductor device having excellent properties is obtained.

Further, in the seventh embodiment, the source and the drain (epitaxial semiconductor portions 61) are formed by forming Si or SiC containing impurity by epitaxial growth. Therefore, it is unnecessary to perform high-temperature heat treatment, which is required when the source and the drain are formed by ion implantation. Therefore, excessive diffusion of impurities is prevented, and it is possible to suppress the short channel effect and reduce parasitic capacitance. Therefore, a semiconductor device having excellent properties also in these respects is obtained.

EMBODIMENT 8

Figure 40A:
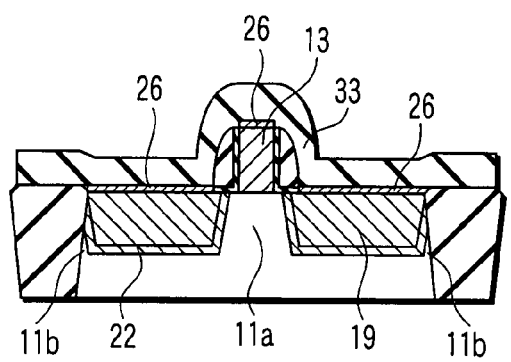
FIGS. 40A and 40B are schematic cross-sectional views of a structure of a semiconductor device according to an eighth embodiment of the present invention.
Figure 40B:
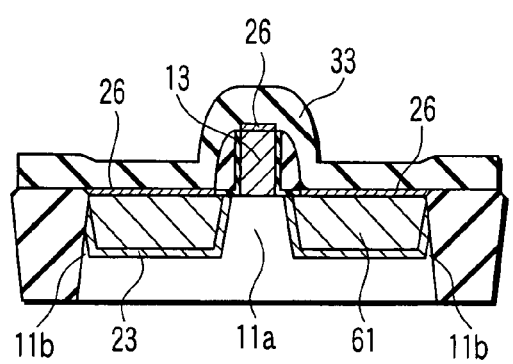

FIGS. 40A and 40B are schematic cross-sectional views of a structure of a semiconductor device according to an eighth embodiment. FIG. 40A is a cross-sectional view of a p-type MIS transistor region thereof, and FIG. 40B is a cross-sectional view of an n-type MIS transistor region thereof. The basic structure and the basic manufacturing method of the eighth embodiment are the same as those of the first embodiment, and thus explanation of the matters which have been explained in the first embodiment is omitted.

In the eighth embodiment, in the p-type MIS transistor region, an epitaxial SiGe layer 19 doped with boron (B) and a stress liner film 33 are formed in the same manner as in the third embodiment. Further, in the eighth embodiment, the n-type MIS transistor region also adopts the same structure as that of the p-type MIS transistor region. Specifically, the source and the drain of the n-type MIS transistor are formed of epitaxial semiconductor portions 61. As the epitaxial semiconductor portions 61, used is Si doped with phosphorus (P) or arsenic (As) or SiC doped with phosphorus (P) or arsenic (As).

Also in the eighth embodiment, wall portions 11b are formed, and thereby a semiconductor device with excellent properties is obtained as in the first embodiment. Further, in the eighth embodiment, both the SiGe layer 19 and the stress liner film 33 apply stress to the channel forming portion 11a. Therefore, a larger stress is applied to the channel forming portion 11a, and the channel mobility of the MIS transistor is effectively increased. Further, in the eighth embodiment, the source and the drain (epitaxial semiconductor portions 61) are formed by forming Si or SiC doped with impurity by epitaxial growth, as in the seventh embodiment. Therefore, like the seventh embodiment, excessive diffusion of impurities due to high-temperature heat treatment is prevented, and it is possible to suppress the short channel effect and reduce parasitic capacitance.

EMBODIMENT 9

Figure 41A:
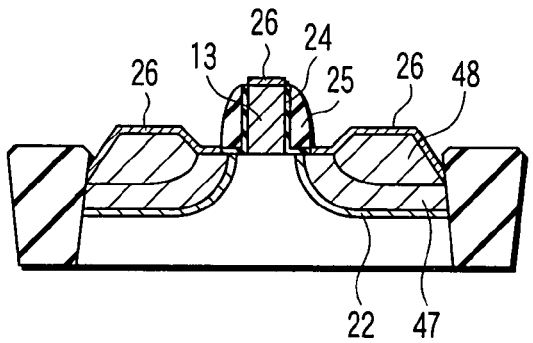
FIGS. 41A and 41B are schematic cross-sectional views of a structure of a semiconductor device according to a ninth embodiment of the present invention.
Figure 41B:
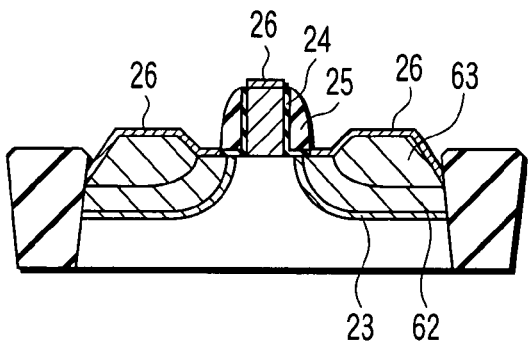

FIGS. 41A and 41B are schematic cross-sectional views of a structure of a semiconductor device according to a ninth embodiment. FIG. 41A is a cross-sectional view of a p-type MIS transistor region thereof, and FIG. 41B is a cross-sectional view of an n-type MIS transistor region thereof. The basic structure and the basic manufacturing method of the ninth embodiment are the same as those of the fourth embodiment, and thus explanation of the matters which have been explained in the fourth embodiment is omitted.

In the ninth embodiment, epitaxial SiGe layers 47 and 48 doped with boron (B) are formed in the p-type MIS transistor region, in the same manner as in the fourth embodiment. Further, in the ninth embodiment, the n-type MIS transistor region also adopts the same structure as that of the p-type MIS transistor region. Specifically, epitaxial semiconductor portions 62 and 63 form the source and the drain of the n-type MIS transistor. The epitaxial semiconductor portions 62 are formed under conformal epitaxial growth conditions, and the epitaxial semiconductor portions 63 are formed under highly-selective epitaxial growth conditions (epitaxial growth conditions with which facets are formed). As the epitaxial semiconductor portions 62 and 63, used is Si doped with phosphorus (P) or arsenic (As) or SiC doped with phosphorus (P) or arsenic (As).

Also in the ninth embodiment, the conformal epitaxial semiconductor portions 62 are formed, and thereby a semiconductor device having excellent properties is obtained as in the fourth embodiment. Further, like the seventh embodiment, the source and the drain (epitaxial semiconductor portions 62 and 63) are formed by forming Si or SiC doped with impurity by epitaxial growth. Therefore, as in the seventh embodiment, excessive diffusion of impurities due to high-temperature heat treatment is prevented, and it is possible to suppress the short channel effect and reduce parasitic capacitance.

EMBODIMENT 10

Figure 42A:
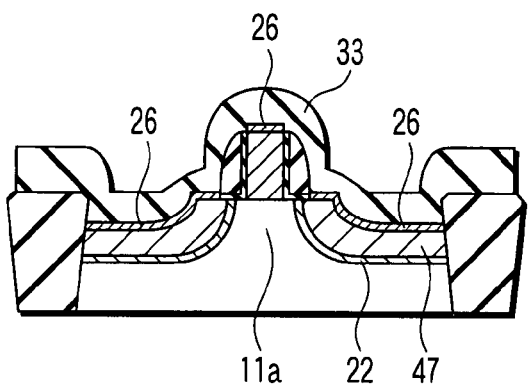
FIGS. 42A and 42B are schematic cross-sectional views of a structure of a semiconductor device according to a tenth embodiment of the present invention.
Figure 42B:
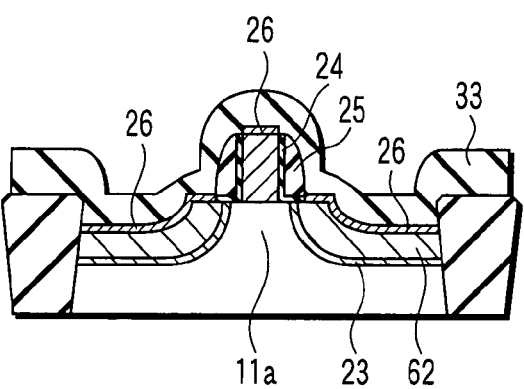

FIGS. 42A and 42B are schematic cross-sectional views of a structure of a semiconductor device according to a tenth embodiment. FIG. 42A is a cross-sectional view of a p-type MIS transistor region thereof, and FIG. 42B is a cross-sectional view of an n-type MIS transistor region thereof. The basic structure and the basic manufacturing method of the tenth embodiment are the same as those of the fourth embodiment, and thus explanation of the matters which have been explained in the fourth embodiment is omitted.

In the tenth embodiment, an epitaxial SiGe layer 47 doped with boron (B) and a stress liner film 33 are formed in the p-type MIS transistor region, in the same manner as in the sixth embodiment. Further, in the tenth embodiment, the n-type MIS transistor region also adopts the same structure as that of the p-type MIS transistor region. Specifically, epitaxial semiconductor portions 62 form the source and the drain of the n-type MIS transistor, and a stress liner film 33 is also formed in the n-type MIS transistor region. The epitaxial semiconductor portions 62 are formed under conformal epitaxial growth conditions. As the epitaxial semiconductor portions 62, used is Si doped with phosphorus (P) or arsenic (As) or SiC doped with phosphorus (P) or arsenic (As).

Also in the tenth embodiment, conformal epitaxial semiconductor portions 62 are formed, and thereby a semiconductor device having excellent properties is obtained, as in the fourth embodiment. Further, in the tenth embodiment, the stress liner film 33 is formed, and thereby a sufficient stress is applied to the channel forming portion 11a as stated in the sixth embodiment. Therefore, the channel mobility of the MIS transistor is effectively increased, and a semiconductor device having excellent properties is obtained. Further, as in the seventh embodiment, the source and the drain (epitaxial semiconductor portions 62) are formed by forming Si or SiC doped with impurity by epitaxial growth. Therefore, as in the seventh embodiment, excessive diffusion of impurities due to high-temperature heat treatment is prevented, and it is possible to suppress the short channel effect and reduce parasitic capacitance.

The first to tenth embodiments described above can be variously modified as follows.

In the above first to tenth embodiments, although SiGe is used as the epitaxial semiconductor portions of the p-type MIS transistor region, other semiconductors such as Si can be used. In the case of using other semiconductors, it may not be possible to apply stress to the channel forming portion, it is possible to prevent excessive diffusion of impurities due to high-temperature heat treatment, as in the n-type MIS transistor region explained in the seventh to tenth embodiments. Consequently, it is possible to obtain the effect of suppression of the short channel effect and reduction in parasitic capacitance.

Further, although a bulk silicon substrate is used as the semiconductor substrate in the above first to tenth embodiments, an SOI substrate may be used.

Furthermore, in the first to tenth embodiments, a silicide film is formed as a conductive portion on the epitaxial semiconductor portions. However, a conductive portion such as a metallic film may be formed on the epitaxial semiconductor portions.

Further, in the first to tenth embodiment, the side wall spacers formed on the side walls of the gate electrode are formed of a single-layer silicon oxide film, a single-layer silicon nitride film, or a stacked film comprising a silicon oxide film and a silicon nitride film. However, side wall spacers having other structures may be used.

Furthermore, in the first to tenth embodiments, an epitaxial SiGe layer doped with boron (B) is formed when the epitaxial semiconductor portions are formed. However, a non-doped epitaxial SiGe layer may be formed, and thereafter boron (B) may be implanted into the non-doped epitaxial SiGe layer.

Further, in the first to tenth embodiments, deep source/drain regions are formed before extension regions of the source/drain are formed. However, deep source/drain regions may be formed after their extension regions are formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    an isolation region;
    a semiconductor element region defined by the isolation region, and having a channel forming portion and a recessed portion, the recessed portion being formed between the isolation region and the channel forming portion; and
    an epitaxial semiconductor portion formed in the recessed portion,
    wherein the semiconductor element region has a wall portion between a side surface of the isolation region and a side surface of the epitaxial semiconductor portion,
    wherein the epitaxial semiconductor portion includes a lower epitaxial portion formed on a bottom surface of the recessed portion, and an upper epitaxial portion formed on the lower epitaxial portion, and
    wherein a semiconductor material of the lower epitaxial portion is different from a semiconductor material of the upper epitaxial portion.

2. The semiconductor device according to claim 1, further comprising:
    a conductive portion formed on the epitaxial semiconductor portion.

3. The semiconductor device according to claim 1, wherein the epitaxial semiconductor portion applies stress to the channel forming portion.

4. The semiconductor device according to claim 1, wherein a thickness of the wall portion is reduced from a bottom toward a top thereof.

5. A semiconductor device comprising:
    an isolation region;
    a semiconductor element region defined by the isolation region, and having a channel forming portion and a recessed portion, the recessed portion being formed between the isolation region and the channel forming portion;
    a gate structure formed on the semiconductor element region; and
    an epitaxial semiconductor portion formed in the recessed portion, and including a lower epitaxial portion and an upper epitaxial portion, the lower epitaxial portion being formed in a conformal manner on a bottom surface of the recessed portion and being in contact with the isolation region and a bottom surface of the gate structure, the upper epitaxial portion being formed on the lower epitaxial portion and having a facet which faces a side surface of the isolation region.

6. The semiconductor device according to claim 5, further comprising:
    a conductive portion formed on the epitaxial semiconductor portion.

7. The semiconductor device according to claim 5, wherein the epitaxial semiconductor portion applies stress to the channel forming portion.

8. The semiconductor device according to claim 5, wherein a semiconductor material of the lower epitaxial portion is different from a semiconductor material of the upper epitaxial portion.

9. A semiconductor device comprising:

an isolation region;

a semiconductor element region defined by the isolation region, and having a channel forming portion and a recessed portion, the recessed portion being formed between the isolation region and the channel forming portion;

an epitaxial semiconductor portion formed on a bottom surface of the recessed portion in a conformal manner, and being in contact with the isolation region; and a stress generating film covering the epitaxial semiconductor portion and applying stress to the channel forming portion, wherein the epitaxial semiconductor portion has a recessed portion based on the recessed portion of the semiconductor element region, the stress generating film being formed of a silicon nitride film, and a part of the stress generating film fills the recessed portion of the epitaxial semiconductor portion.

10. The semiconductor device according to claim 9, further comprising:

a conductive portion formed on the epitaxial semiconductor portion.

11. The semiconductor device according to claim 9, wherein the epitaxial semiconductor portion applies stress to the channel forming portion.

12. The semiconductor device according to claim 1, further comprising:

a stress generating film covering the epitaxial semiconductor portion and applying stress to the channel forming portion.

13. The semiconductor device according to claim 5, further comprising:

a stress generating film covering the epitaxial semiconductor portion and applying stress to the channel forming portion.

* * * * *